United States Patent [19]

Lee

[11] Patent Number: 5,305,006
[45] Date of Patent: Apr. 19, 1994

[54] SOLITON-PHASE ANALOG-TO-DIGITAL CONVERTER

[75] Inventor: Gregory S. Lee, Mountain View, Calif.

[73] Assignee: Hewlett-Packard Company, Palo Alto, Calif.

[21] Appl. No.: 67,327

[22] Filed: May 25, 1993

Related U.S. Application Data

[63] Continuation-in-part of Ser. No. 936,196, Aug. 26, 1992.

[51] Int. Cl.⁵ .............................................. H03M 1/00
[52] U.S. Cl. .................................... 341/155; 341/133; 505/827
[58] Field of Search .................... 341/155, 13, 14, 137, 341/133; 505/827

[56] References Cited

U.S. PATENT DOCUMENTS 5,078,464  1/1992  Islam ..................................... 385/122

Primary Examiner—Brian K. Young

[57] ABSTRACT

A superconducting analog-to digital converter comprises an input line, a soliton generator, a phase sampler, and a decoder. The soliton generator includes a nonlinear transmission line and a gradient current source. The transmission line is a series of inductive links separated from a superconducting ground plane by Josephson junction. The gradient current source induces gradient pump currents that are inductively coupled into the transmission line. The gradient establishes a three-cycle soliton. A time-varying current input signal is inductively coupled to the transmission line so that the local pump current changes as a function of changes in the input signal. These changes cause the soliton to move, and thus change its phase, along the transmission line. Sixty-four comparators of the phase sampler track the phase of the soliton. The digital readout of the phase sampler is then decoded to determine the value of the signal input. This configuration provides for 6-7 bits of subquantum resolution so that the ADC is well suited as an interpolator for grosser ADCs.

10 Claims, 6 Drawing Sheets

SOLITON-PHASE ANALOG-TO-DIGITAL CONVERTER

BACKGROUND OF THE INVENTION

This application is a continuation-in-part of copending patent application Ser. No. 07/936,196, filed Aug. 26, 1992.

The present invention relates to signal processing and, more particularly, to analog-to-digital converters. A major objective of the present invention is to provide for greater resolution analog-to-digital conversion using superconducting devices. A primary application of the invention is to provide interpolation for grosser analog-to-digital converters.

Analog-to-digital converters (ADCs) have become ubiquitous as interfaces between a practically analog world and digital information processors. The fidelity with which an ADC can represent an analog signal depends in part on the sample rate of the ADC. Higher frequency signal components require higher sampling rates for faithful digital representation of the analog waveform. Generally, high fidelity ADCs require a sampling rate of at least twice the highest frequency component of the signal to be converted. For signals with gigahertz frequency components, ADCs require switches with subnanosecond response times.

Superconducting devices incorporating Josephson junctions provide sufficiently fast switching for converting gigahertz frequency signals. Several superconducting devices can be used in parallel to provide a wider range of resolvable signal values. To obtain high fidelity conversions using parallel superconducting devices requires precise matching of components for accurate high-precision readouts. Even when these tolerance problems are addressed, the resolution of such devices is limited by the periodicity of the Josephson junctions, defined by a flux quantum $\phi_0 = 2.07 \cdot 10^{-15}$ Webers (Wb).

To "break through" the flux quantum resolution barrier, various superconducting subquantum ADCs have been proposed for use as interpolators for grosser ADCs. Herein, the "subquantum resolution" of an ADC refers to the smallest resolvable signal difference in flux quantum units. This resolution can be expressed in bits. For example, an ADC with two bits of subquantum resolution resolves signal levels that are nominally $\phi_0/4$ apart.

A SQUID wheel has been proposed to provide for subquantum interpolation. (SQUID is an acronym for "Superconducting QUantum Interference Device".) A SQUID wheel with p bits of nominal subquantum resolution of the wheel has $2^p$ "spokes". Each spoke extends between a wheel rim and a center ground; each spoke includes a Josephson junction and a small inductance so that the junctions are phased $2\pi/2^p$ apart. The junctions respond periodically to an external magnetic flux (resulting from an inductively coupled input signal current). The periodicities are precisely matched across junctions due to the common flux quantum $\phi_0$.

Different flux biases are applied to the Josephson junctions to establish a single-cycle sinusoidal magnetic field that is wrapped about the wheel so that the sinusoid closes on itself. The peak of the sinusoid can be read like the hand of a clock to determine the phase of the magnetic field, thus permitting signal resolution below one flux quantum. The wheel can be read with $2^{p-1}$ flux comparators coupled to pairs of diagonally opposing spokes. An illustrative SQUID wheel includes eight spokes (p=3) and four comparators. While a superficially appealing approach to subquantum interpolation, the SQUID wheel can be plagued by crosstalk because for $p \geq 3$, there are many nonorthogonal crossing comparators. Furthermore, the number of superconducting layers increases geometrically with p.

The limitations of the SQUID wheel are addressed in part by a phase wheel, described in patent application Ser. No. 07/936,196. The phase wheel employs current comparators in series with Josephson junctions at the rim of the wheel. This arrangement reduces crosstalk since current comparators are non-crossing and do not interfere, even when they are nonorthogonal.

However, the phase wheel shares the circular geometry of the SQUID wheel. The phase wheel does not have to contend with crossing comparators. Nevertheless, common clock and bias signals must be distributed to a circular array of circuit elements. As the phase wheel is scaled to higher resolutions, its outer circumferences becomes larger and the numbers of lines and elements near the center increase. Where two levels of interconnect can suffice for a Cartesian design, several interconnect levels can be required for routing interconnects in a circular design. The number of levels for the phase wheel does not increase geometrically as it does with the SQUID wheel, a requirement of 4-5 superconducting levels exceeds state-of-the-art processing technology.

A phase tree, also described in parent application Ser. No. 07/936,196, is a subquantum ADC that has a hierarchical layout rather than a circular layout. The phase tree distributes the input signal via a branching hierarchy. The finest level of the hierarchy is flux biased to establish a linear single-cycle sinusoidal waveform. Comparators distributed along the length of this waveform are used to locate the peak, and thus determine the phase.

The phase tree is subject to Cartesian layouts, so design and scaling are much simpler than for the SQUID wheel and the phase wheel. Scaling is still a problem since higher resolutions require more levels to the hierarchy. However, the expanding hierarchy does not necessitate additional superconducting levels.

Another fundamental problem with all these subquantum ADCs is that, as they are scaled, the sinusoidal waveform spreads. As the sinusoid spreads, its peak flattens, lowering the signal-to-noise ratio. In a Heisenberg like trade-off, as one attempts to identify the location of a peak with greater precision, the peak itself becomes less pronounced.

It is estimated that, due to layout limitations, parasitic inductances, and peak spreading, the practical subquantum resolution limits of the above described devices are: one bit for the SQUID wheel, two bits for the phase wheel, and four bits for the phase tree. In each case, nominal resolution can be exceeded by up to one bit by providing for "mid-phase" readings. Even with the extra bit, the subquantum ADCs described above fall short of the desired resolution. What is needed is a subquantum ADC which provides simpler layouts, even at lower resolutions, and provides for more practical scaling to higher resolutions.

SUMMARY OF THE INVENTION

The present invention uses a periodic soliton as an intermediary between an input signal and a sampling phase detector. A soliton is a nonsinusoidal waveform that retains its shape. Sinusoidal waveforms retain their shapes naturally, while nonsinusoidal waveforms tend to disperse over time. However, in some cases, nonlinearities in the waveform medium and/or the continuing presence of the forces that established the waveform, can maintain the shape of a nonsinusoidal waveform, thus establishing a soliton.

The solitons of interest herein share with the sinusoid a "wrap-around" periodicity. A waveform has this type of periodicity when there is a displacement of the waveform that maps it onto itself in its original position. It is this periodicity that allows an assignment of phase to the periodic soliton.

The present invention requires that a signal input be coupled to a soliton generator so that the phase of the soliton changes as a function of changes in the value of a signal received at the input. This function has a periodicity corresponding to the soliton's periodicity. A phase sampler detects the soliton's phase and provides digital representations thereof. These digital representations can be decoded to indicate the signal value, modulo the function's periodicity. Signal values that differ by more that the amount corresponding to this periodicity can be distinguished by a grosser ADC that incorporates an ADC of the present invention as an interpolator.

Surprisingly, the substitution of the soliton for the sinusoid of the prior art offers significant advantages. In hindsight, it can be seen that the sinusoid suffers from the constraint that the ratio of the cycle length to the peak width is fixed, whereas periodic solitons can have their peak widths established independently of their cycle lengths. The present invention provides for increasing the period-to-peak ratio as the soliton dimensions are scaled to higher ADC resolutions, thereby avoiding the loss of signal-to-noise ratio that afflicts scaled sinusoids. Thus, in a 4-bit ADC in accordance with the present invention, the period-to-peak ratio is more than twice the corresponding ratio for a sinusoid. The differences become even more dramatic at higher resolutions.

The resolution of the phase sampler is limited by the number of distinct phase locations along the periodic soliton at which samples are taken. At each of these phase locations, a respective sensor determines whether the local soliton intensity exceeds a predetermined threshold. For example, each sensor can be a comparator with one input coupled to sense the local level of the soliton and the other input connected to a threshold bias.

For the case of n distinct phase locations, the periodic soliton is shaped so that, for each sampling event: 1) the soliton is above threshold in at most $2+\log_2(n)$ phase locations; and 2) the soliton is below threshold in at most $n-2$ phase locations. The first requirement provides that the peak is progressively concentrated at higher resolutions to offset signal-to-noise ratio losses. The second requirement minimizes hysteresis effects. Preferably, the average number of detecting sensors is half-way between two consecutive integers to provide an extra bit of resolution as is known in the art. To accommodate computational logic, n can be a positive integer power of two; however, the present invention provides for "non-binary" numbers of sensors as well.

To obtain gigahertz rate switching times, the present invention can be implemented using superconducting devices. A superconducting transmission line can be formed with a series of inductive links connected to ground via a corresponding series of Josephson junctions. A magnetic soliton ("fluxon") can be established by imposing a flux gradient along the transmission line; the flux gradient is preferably an integer number of flux quanta in magnitude. The number of flux quanta in the gradient determines the same number of peaks in the soliton.

An input signal in the form of a changing magnetic flux can be applied to all the Josephson junctions of the transmission line. A change in the signal magnitude leaves the slope of the gradient unchanged, but changes the local flux magnitude at every Josephson junction, potentially causing some to undergo a quantum transition. Each such signal change, in effect, causes the soliton to move, i.e., change phase, along the transmission line.

Currents are more readily controlled than magnetic fluxes. Accordingly, the total magnetic field resulting from the superposition of the signal on the gradient can be generated by injecting local "pump" currents into respective links of the transmission line. Like the local flux, each local pump current includes two components, a gradient pump current and a signal pump current. The signal pump currents are the same across Josephson junctions, while the gradient pump currents are graduated.

The signal pump currents can be generated by inductively coupling an input signal line carrying a time-variable current signal to "pump" inductors, which are connected to the transmission line. Gradient currents can be generated in a variety of ways and then be inductively coupled into the pump inductors.

To avoid the problems attending circular layouts, the transmission line can be linear. A three-cycle soliton can be established on such a transmission line. Readings can be taken with reference to the center peak, while the outer peaks serve to isolate the center peak from distortions due to boundary effects from the transmission line endpoints. This arrangement in effect divides the transmission line into a central read section and two end or "ballast" sections. To provide for redundancy, solitons with more than three cycles can be used; in general, the central section is an integer number of cycles long, as is the total length of the two end sections, and as is the total transmission line length.

Boundary effects can be further reduced by tapering down the critical currents of the end section Josephson junctions as a function of distance from the central section. The critical currents of the Josephson junctions in the central section are nominally equal.

Each link in transmission line can be characterized by a parameter $$\beta = \frac{2\pi L_L I_C}{\phi_0}$$

where $L_L$ is the link inductance, $I_C$ is the critical current of the Josephson junctions of the link, and $\phi_0$ is the flux quantum. To meet the requirement that the soliton be below threshold in at most $n-2$ phase locations one can set $\beta < 1$.

The components of the transmission line, signal input, and phase detector can be laid out linearly along side each other. The orthogonal dimension can be used for the required interconnects, clock and bias lines. This offers a great improvement over the SQUID wheel and the phase wheel both in layout and in scaling. Layout is also simplified relative to the phase tree, since bias lines do not need to be duplicated for the different levels of the hierarchy.

Scaling a linear embodiment involves lengthening the signal line, adding links to the transmission line, and adding sensors to a linear sensor array. This is an improvement even over the phase tree, where scaling additionally involves adding levels to a hierarchy as well as lengthening components. Accordingly, ADCs with six and more bits of subquantum resolution can be achieved, in contrast to the practical limitations of 2–4 bits for the ADCs discussed in the background section. These and other features and advantages of the present invention are apparent from the description below with reference to the following drawings.

BRIEF DESCRIPTION OF THE DRAWINGS

FIG. 6 is a schematic view of an six-bit ADC in accordance with the present invention.

Figure 1:
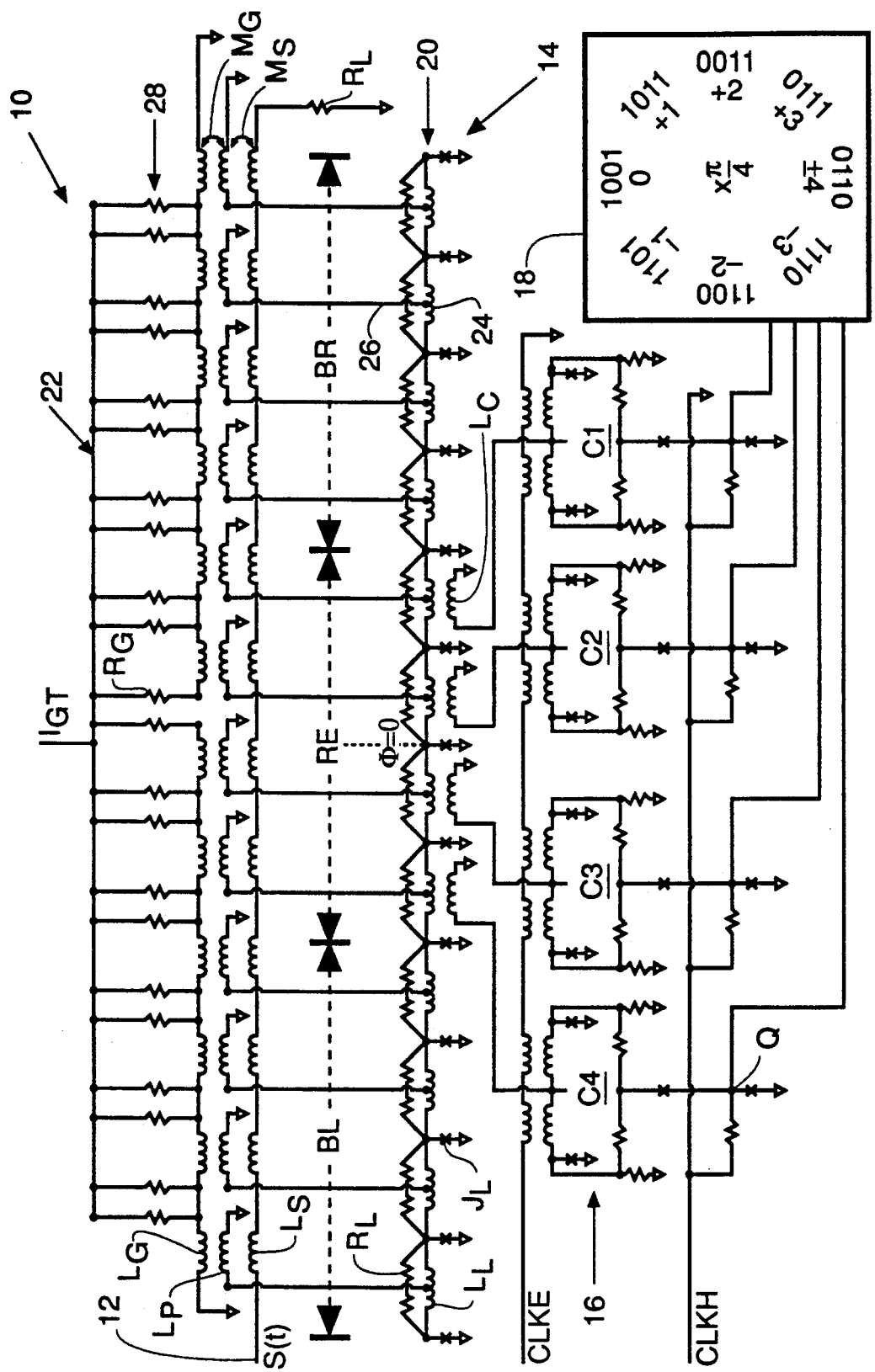
FIG. 1 is a schematic view of a two-bit ADC in accordance with the present invention.

In the figures, numbers in italics represent numerosity and are not reference numerals.

DESCRIPTION OF THE PREFERRED EMBODIMENTS

In accordance with the present invention, a two-bit ADC 10 comprises an input line 12, a soliton generator 14, a phase sampler 16, and a decoder 18, as shown in FIG. 1. Input line 12 has a series of inductances $L_S$ connected to ground via a resistor $R_S$. Input line 12 is arranged to receive an analog signal S(t), which has a time-varying current.

Graduated transmission circuit 14 includes a superconducting transmission line 20 and a gradient current source 22. Transmission line 14 comprises a series of twelve inductive links 24. Each inductive link 24 has an inductance $L_L$ and a parallel damping resistance $R_L$.

A corresponding series of thirteen Josephson junctions $J_L$ connects both ends of each link 24 to a superconducting ground plane. The critical currents $I_C$ of the series Josephson junctions $J_L$ are tapered toward the ends of transmission line 20, as indicated by the trapezoidal critical current distribution 202 depicted at the bottom of FIG. 2. Thus, Josephson junctions $J_L$ nearer the center of transmission line have critical currents of $I_C(MAX) = 100$ microamps ($\mu a$), while Josephson junctions at the ends of transmission line 20 have critical currents of $I_C(MIN) = 25$ $\mu a$. Alternative embodiments can use other values of $I_C(MAX)$, while a low $I_C(MIN)$ is generally desired to minimize boundary effects.

Local pump currents $I_P$ are injected at respective inductive midpoints of each inductive link 24 via pump lines 26. Each local pump current has two components: a gradient pump current $I_{PG}$ and a signal pump current $I_{PS}$. Both pump components are generated at pump inductances $L_P$. Pump inductances $L_P$ are inductively coupled both to input line 12 and gradient current source 22.

Gradient current source 22 is a symmetrically split current ladder, as shown in FIG. 1. A gradient source total current $I_{GT}$ is distributed by resistors $R_G$ to a series of gradient source inductances $L_G$. The resulting gradient source currents are at a minimum magnitude through the two central inductors and increase in either direction as indicated by the V-shaped gradient source distribution 204 depicted in FIG. 2. The currents in the two halves of the split current ladder are in opposite directions, resulting in a linear current gradient across gradient current source 22.

Gradient inductances $L_G$ are inductively coupled to pump inductances $L_P$ to induce the gradient components of the pump currents. The senses of the gradient inductances to the left are opposed to the pump inductances $L_P$ while the senses of the gradient inductances to the right have the same sense as the pump inductances $L_P$. Accordingly, the gradient components of the pump currents have the linear distribution indicated by line 206 in FIG. 2.

The total current gradient across transmission line 20 is 3$\phi_0$, with zero current through the center Josephson junction. This gradient is achieved by setting the total gradient current into gradient current source 22 to $$I_{GT} = 3\phi_0/M_G$$

where $M_G$ is the mutual inductance between pump inductance $L_P$ and gradient inductance $L_G$.

Due to the non-zero critical current $I_C$ of Josephson junctions $J_L$, the Josephson phase differences are not constant along transmission line 20. Accordingly, the associated magnetic fluxes are not constant along transmission line 20. Instead, large phase drops and flux drops occur at flux quantum midpoints (half-way between points with successive integer multiples of $\phi_0$. This results in a flux distribution that is a three-cycle soliton, shown in its reference position corresponding to readout 1001 in FIG. 2. (In FIG. 2, soliton phases are referenced their corresponding comparator readouts.) The reference position is assumed when the signal current is zero.

In its reference position, the soliton divides transmission line 20 into three sections: a central read section RE, a left ballast section BL and a right ballast section BR. Each section includes a respective set of four inductive links 24. From one point of view, curve 1001 includes two full peaks and two half peaks. However, the viewpoint assumed herein is that each section includes one cycle of the waveform and each cycle includes one peak. When viewed in this way, curve 1001 has six half peaks. Each section has two-half peaks, or the equivalent of one total peak. When the soliton is $\pi$ radians from the reference position, each peak is at the center of its section, in which case the peaks are not split. The half-height peak width is about 2.5 links at the half-height level indicated by line P/2.

Phase sampler 16 has four comparators C1, C2, C3, and C4 that are respectively coupled to the four links of read section RE. Each comparator compares the local magnetic flux with a threshold that, for ADC 10, is set at P/2. The positive readings of the soliton in its reference position are indicated by dots on curve 1001, while negative readings are indicated by circles on curve 1001. The two outer comparators C1 and C4 detect a soliton flux above threshold P/2, while the inner two comparators C2 and C3 have negative indications. As indicated in FIG. 1, decoder 18 translates output 1001 to provide a zero phase indication.

Figure 3:
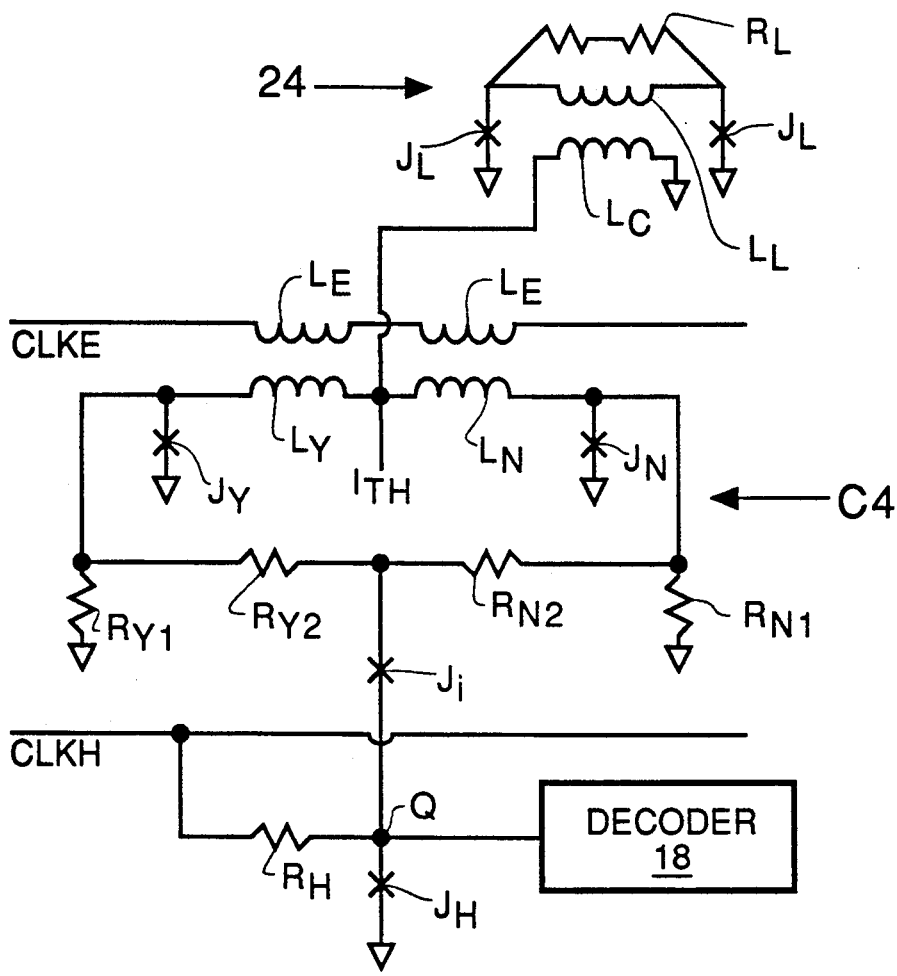
FIG. 3 is a schematic view of a comparator of the ADC of FIG. 1

Comparators C1-C4 are quantum flux parametrons (QFPs). Each comparator has a respective coupling inductance $L_C$ coupled to the inductance $L_L$ of a respective link 24 of read section RE of transmission line 20, as indicated in FIG. 3 for representative comparator C4. This inductive coupling effectively reduces the $\beta$ of transmission line links 24, thereby reducing potential hysteresis relative to a design using current comparators.

Each coupling inductance $L_C$ is connected to a source for a threshold current $I_{TH}$. Threshold current $I_{TH}$ determines the threshold soliton magnitude that triggers a local detection. While the number of detectors activated per sample by a soliton is determined primarily by the soliton shape, fine adjustments to this number can be effected by adjusting this threshold. Preferably, this threshold is set so that the likelihood of an odd number of detections per sample is the same as the likelihood of an even number, thereby achieving the available extra bit of resolution.

While an exciter clock CLKE is high, currents are induced in comparator C4 by the transformer couplings $L_E$ to $L_Y$ and $L_E$ to $L_N$. The induced currents ramp so that ideally, and in the absence of any offset, both the "positive" Josephson junction $J_Y$ and the "negative" Josephson junction $J_N$ would fire simultaneously. Josephson junctions $J_Y$ and $J_N$ operate in single-flux-quantum (SFQ) mode.

Figure 2:
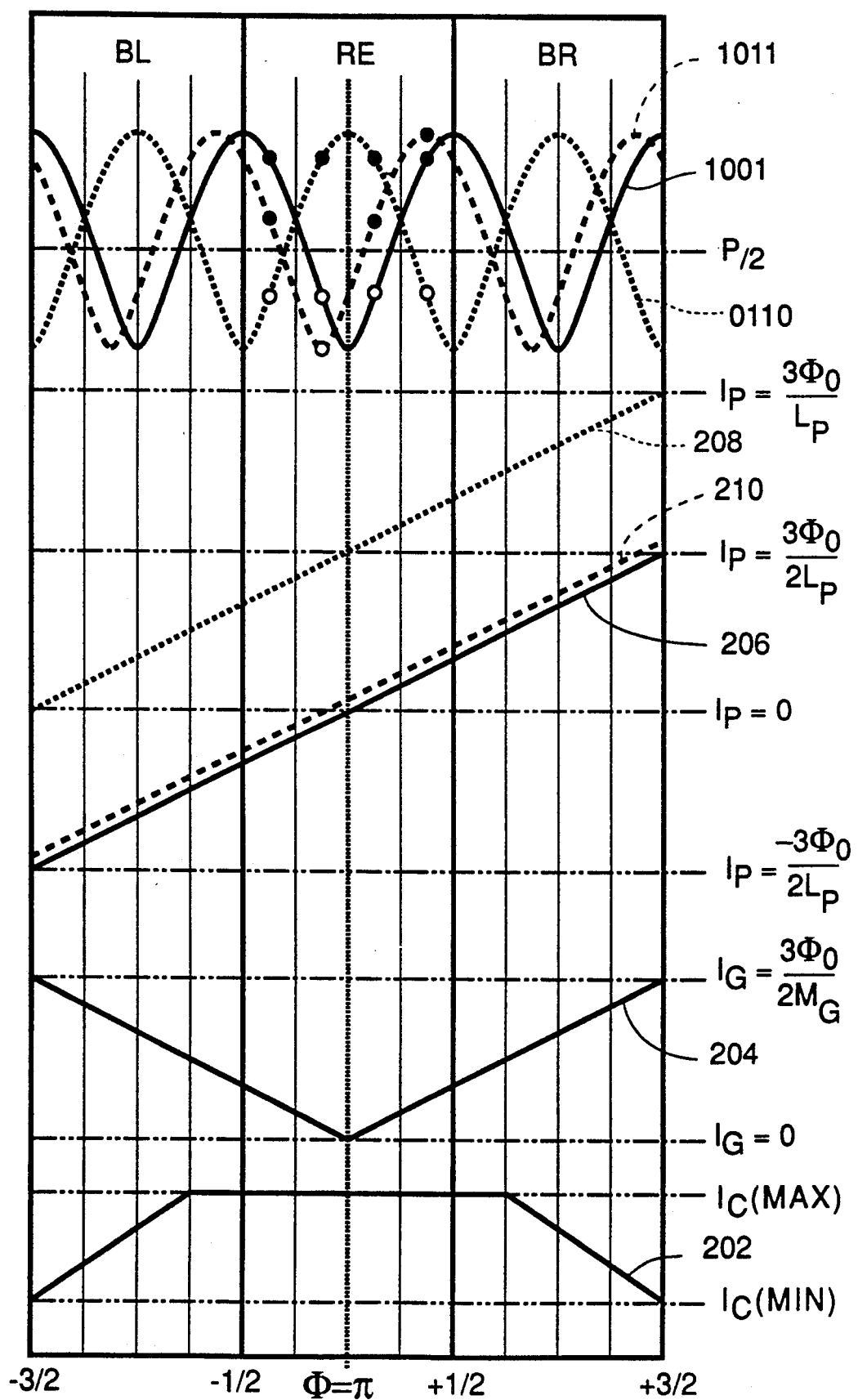
FIG. 2 is a graphic view of certain features of the ADC of FIG. 1.

When the soliton is in its centralized reference position of curve 208, FIG. 2, a net positive current is induced into comparator C4 by its respective link 24. This positive current causes junction $J_Y$ to pulse positively, inhibiting the triggering of $J_N$. The positive pulse is directed to latch junction $J_H$ via a current divider having resistors $R_{Y1}$ and $R_{Y2}$.

Figure 4:
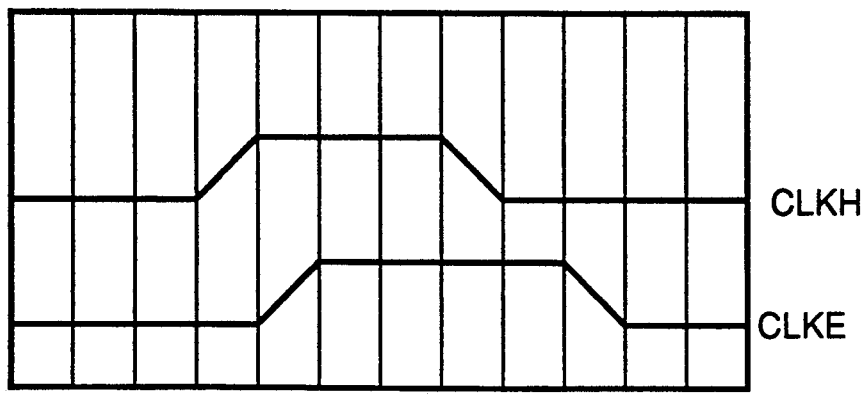
FIG. 4 is a timing diagram for the comparator of FIG. 2.

At this point, a latch clock CLKH is already high and positive, as indicated in FIG. 4. Latch clock CLKH is connected to comparator output Q via a resistor $R_H$. Accordingly, latch junction $J_H$ enters its voltage state, resulting in a voltage high output at output node Q. This results in a voltage high output to the fourth-bit input of decoder 18. Concurrently, an isolation Josephson junction $J_i$ enters its voltage state, isolating Josephson junctions $J_Y$ and $J_N$ from the positive voltage state.

A soliton $\pi$ radians from the reference position has its central peak in the $\pi$ position, as indicated by curve 0110 in FIG. 2. A soliton in this 0110 position results when the pump currents are distributed as indicated by line 208 in FIG. 2. This distribution occurs when the pump signal component $I_{PS}$ is $\phi_0/2M_S$, modulo $\phi_0/M_S$. Inspection of decoder 18 in FIG. 1 indicates that 0110 corresponds to phase position $\pm 4\cdot\pi/4 = \pi$.

A soliton in the $\pi$ position induces a net negative current into comparator C4 by its respective link 24. Junction $J_N$ pulses negatively, inhibiting junction $J_P$. A negative pulse is sent, via a current divider constituted by resistors $R_{N1}$ and $R_{N2}$, to latch junction $J_H$. Latch junction $J_H$ thus remains in its zero voltage state. Accordingly, output Q of comparator C4 remains low.

Decoder 18 samples its inputs between the time CLKE goes high and the time CLKL goes low. The latch junction $J_H$ and the isolation junction $J_i$ reset when CLKL goes low; junctions $J_Y$ and $J_N$ reset when CLKE goes low.

As input signal S(t) increases from zero, the local pump current $I_P$ into each link increases, while the gradient across transmission line 20 remains unchanged. Line 210 in FIG. 2 shows the pump current distribution when its signal component $I_{PS}$ is $\phi_0/8M_S$, where $M_S$ is the mutual inductance between signal inductors $L_S$ and pump inductors $L_P$.

Note that the slope of line 210 is the same as the slope of line 206, but the horizontal position at which line 210 crosses $I_P = 0$ is to the left of the point at which line 206 crosses $I_P = 0$. This zero pump current point corresponds to a soliton valley, suggesting that the small increase in signal current corresponds to a leftward shifting of the soliton. The leftward position of the soliton when the signal pump current $I_{PS} = \phi_0/8M_S$ is indicated by curve 1011. As indicated by decoder 18 in FIG. 1, 1011 is decoded as $+1\cdot\pi/4 = \pi/4$.

Comparing the outputs, it is apparent that 1001 has two 1s while 1011 has three 1s. Examining the functional depiction of decoder 18 in FIG. 1, it is apparent that there are eight possible readouts, half with two 1s and half with three 1s. This illustrates how $2^3$ discriminations can be made using $2^2$ discriminators. The additional bit of information is fully realized only if, for a random soliton phase, the likelihood of a "three 1" readout is the same as the likelihood of a "two 1" readout. In the present case, $\beta$ is set so that the half-height peak width $W_P$ is approximately 2.5 links wide, and $I_{TH}$ is set at the half-height flux level. To the extent that the half-height peak width of the soliton differs from 2.5 links wide, the relative likelihood of even and odd numbers of detection 1s can be equalized by adjusting $I_{TH}$ above or below the half-peak flux level.

The extra bit could also be realized by setting $W_P$ to 1.5 or 3.5. 2.5 is favored over 3.5 because of its better signal-to-noise ratio. In addition, it is preferable to ensure that at least one 1 and at least one 0 show up in each output to inspire confidence that the appropriate differentiations are being made. $W_P = 1.5$ is disfavored because likely hysteresis effects would blunt the accuracy of the readout.

Figure 5:
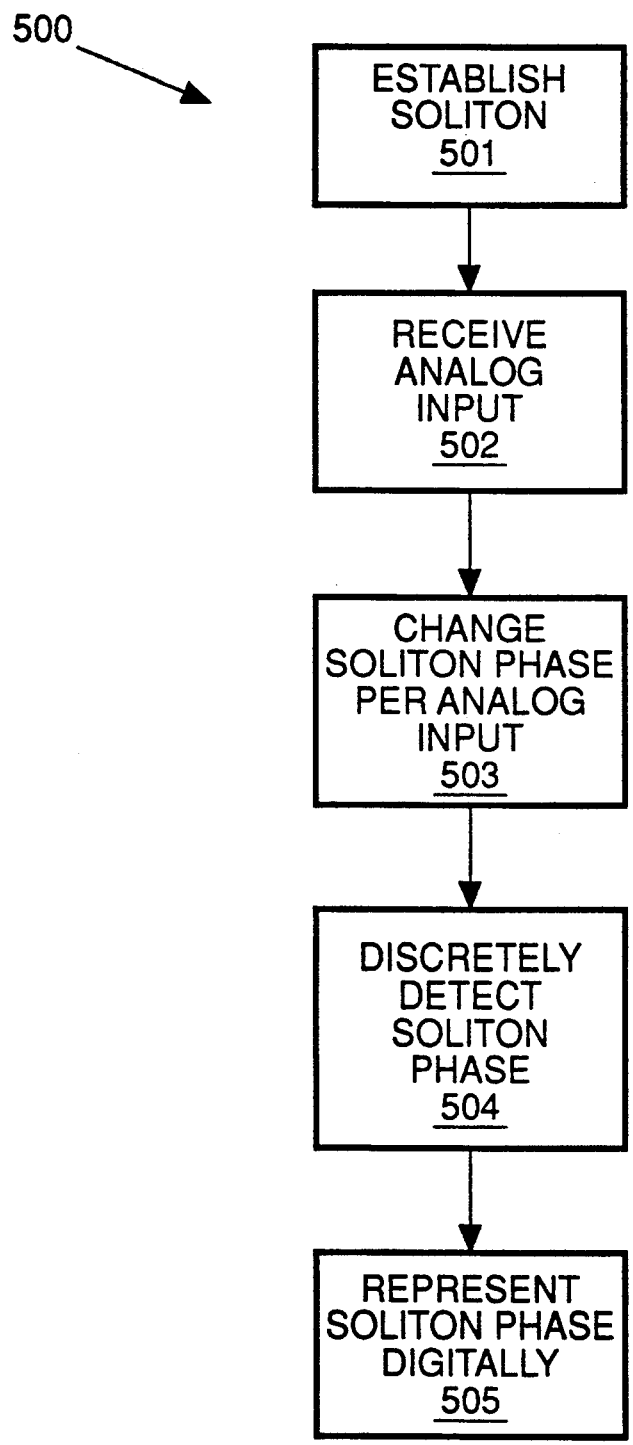
FIG. 5 is a flow chart of a method in accordance with the present invention.

The method 500 described above in conjunction with ADC 10 is summarized in the flow chart of FIG. 5. The soliton is established at step 501, for example, by setting up the transmission line and providing the current gradient. Then analog input signal S(t) is received at step 502. Signal S(t) is coupled so as to change the soliton phase as a function of the signal value at step 503. The phase of the soliton is discretely detected at step 504. The detected phase is digitally represented at step 505. In ADC 10, the digital representation occurs twice: first as the collective comparator output of phase sampler 16, and then as the decoded output of decoder 18.

Figure 6:
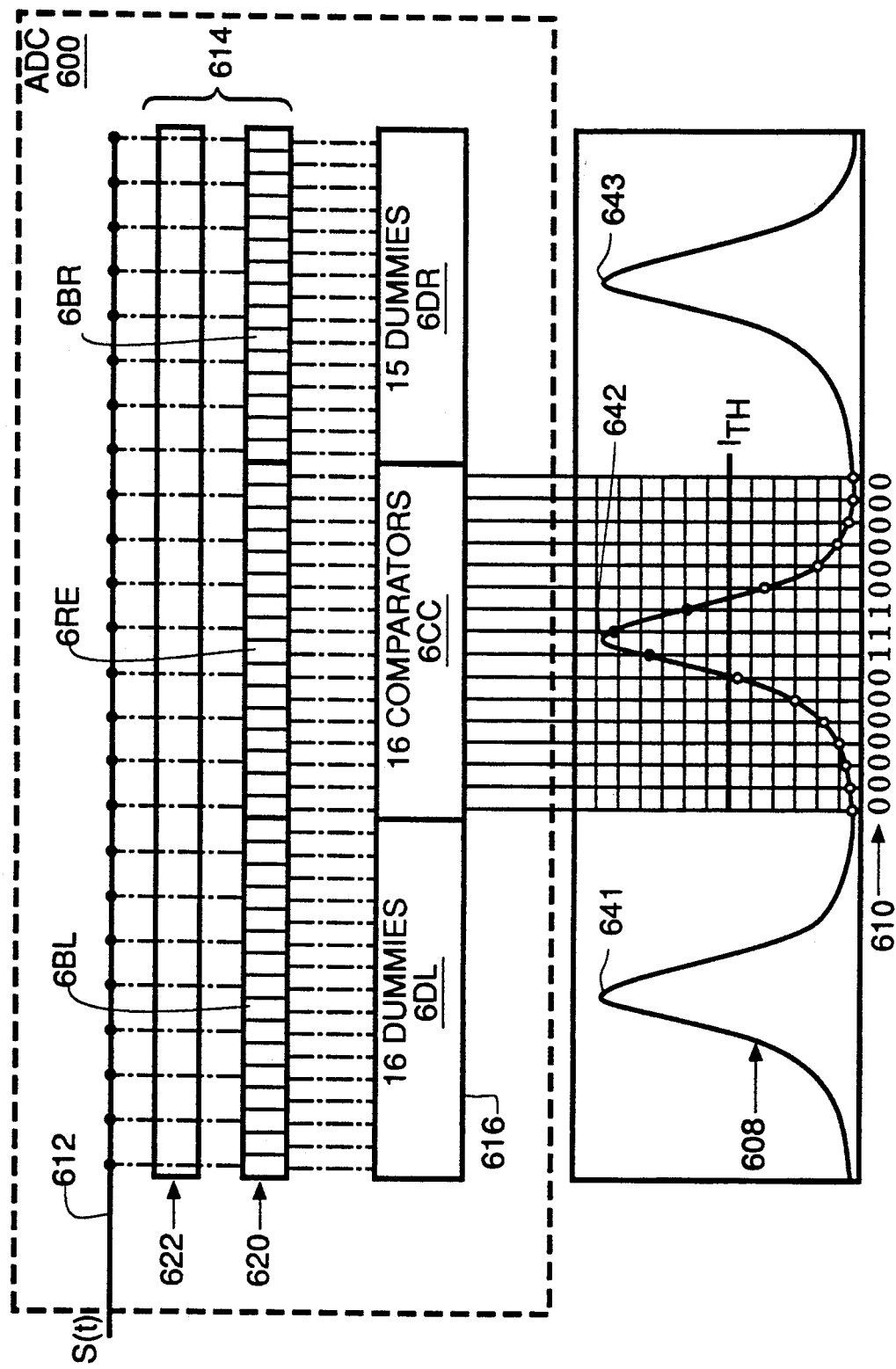
FIG. 6 is a schematic view of a four-bit ADC in accordance with the present invention.

Method 500 can be applied to higher resolution ADCs. Accordingly, a 4-bit ADC 600 also includes an input line 612, a soliton generator 614, and a phase sampler 616, as shown in FIG. 6. Soliton generator 614 includes a Josephson junction (nonlinear) transmission line 620 and a gradient source 622 for imposing the gradient bias required to establish a soliton thereon. As in ADC 10, transmission line 620 of ADC 600 is divided into three sections, a left ballast section 6BL, a central read section 6RE, and a right ballast section 6BR. Input line 612 is inductively coupled to transmission line 620, which in turn is inductively coupled to phase sampler 616. (In FIGS. 6 and 7, inductive couplings are indicated by vertical dot-dash lines.)

There are three obvious ways in which ADC 600 is not a direct scaling of ADC 10: 1) in ADC 10 every link is coupled to the signal input, while in ADC 600 only every other link is so coupled; 2) in ADC 10, all transmission line sections have the same number of links, whereas, in ADC 600, left ballast section 6BL is one short; and 3) in ADC 10 comparators are coupled only to its central read section, whereas in phase sampler 616 has, in addition to comparators coupled to links of read section 6RE, "dummy" comparators that are coupled to the links of the ballast sections 6BL and 6BR.

A dummy comparator is designed to affect a respective link 24 in the same manner that a comparator affects its respective link 24. To this end, a dummy comparator can include comparator components that have the most significant effect on the respective link, while omitting other functional components. In comparison with the comparator C4 of FIG. 3, a dummy comparator of ADC 600 includes inductors $L_C$, $L_Y$ and $L_N$, Josephson junctions $J_Y$ and $J_N$, and resistors $R_{Y1}$ and $R_{N1}$. Other components, including the clock lines, and the connection to decoder 18 are omitted.

The sparser arrangement of inductive couplings between input line 612 and graduated transmission line 620 simplifies the circuit. Inspecting the representation of ADC 10 in FIG. 1, it is apparent that most Josephson junctions $J_L$ are fed twice. Therefore, half the couplings between input line 12 and transmission line 20 could be omitted and the gradient would still be in place. Since every link is fed, there are twelve gradient steps instead of six. The greater number of steps results in a smoother gradient, reducing hysteresis. In ADC 600, the sparse layout results in 24 gradient steps, which provides an adequately smooth gradient. The same sparse layout would also apply to higher bit ADCs.

The odd number of links in right ballast section 6BR is related to the sparse arrangement of input line couplings. The outer Josephson junction of a sixteenth link in this section would not be fed a pump current. Since it would thus not contribute to the gradient, it is omitted.

Comparator bank 616 includes three sections, a left dummy section 6DL, a central comparator section 6CC, and a right dummy section 6DR. Central comparator section 6CC serves the same function for ADC 600 that comparator bank 16 serves for ADC 10. The dummy comparators maintain the regularity of $\beta$, which is affected by the presence of the comparator inductors. By preserving this regularity, boundary and reflection effects between read section 6RE and the ballast sections 6BL and 6BR are minimized.

The normalized $\beta$ for the links of read section 6RE is nominally set at 0.6, achieving the soliton shape of curve 608 indicated near the bottom of FIG. 6. Note that curve 608 has three peaks 641, 642, and 643. Readings are taken from center peak 642. Positive readings of comparator section 6CC are indicated by dots and negative readings by circles for the illustrated arbitrary soliton phase. The collective readout is shown as 0000,0001,1100,0000 at the base of FIG. 6. With the threshold set just above the mid-peak level, three 1s are included. As is apparent from visual inspection of the graph, a slight leftward shifting of the illustrated peak would result in a reading of 0000,0011,1100,0000, which has four 1s.

When compared with the soliton of ADC 10, the soliton of ADC 600 extends over a larger number of links (3.5 instead of 2.5), but over a smaller proportion of the soliton cycle (62.5% for ADC 10, ~22% for ADC 600). The greater absolute number of links provides for further reductions in hysteresis. The smaller proportion of the soliton cycle provides an improved signal-to-noise ratio.

Generally, the number of positive detections (1s) for a p-bit system should be between 2, to avoid hystersis, and 2+p, to optimize signal-to-noise ratios. Of course, the selection of binary resolutions is intended to accommodate modern digital circuitry. The invention provides for nonbinary resolutions, in which the range of 1s for n detectors should be between 2 and $2+\log_2(n)$. Where redundant sensors are used, the redundant sensors should be ignored in the relationship. "n" actually refers to the number of distinct phase points at which detections are made, rather than the number of sensors employed.

Figure 7:
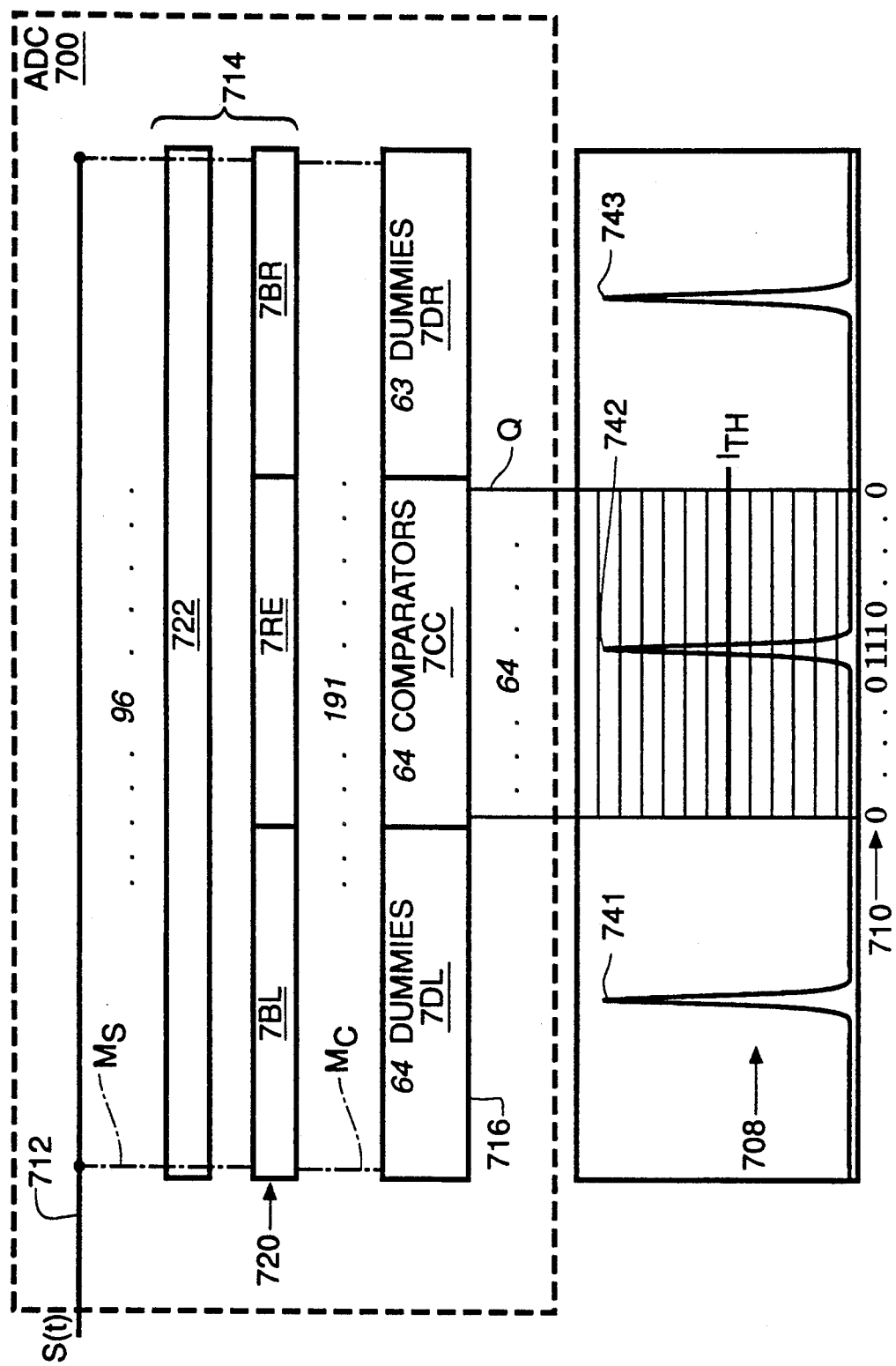
FIG. 7 is a schematic view of an six-bit ADC in accordance with the present invention.

Method 500 also applies to ADCs with resolutions exceeding those attainable by the devices described in the background section. According, an six-bit ADC 700 in accordance with the present invention includes a signal input line 712, a soliton generator 714 and a phase sampler 716, as shown in FIG. 7.

ADC 700 quantitatively differs from ADC 600 in several respects. Input line 712 is coupled to soliton generator 714 via 3·32=96 mutual inductances $M_S$, where the corresponding number is 24 for ADC 600. Transmission line 720 has 191 inductive couplings to phase sampler 716, as opposed to 47 for ADC 600. A like comparison applies for the 191 inductive couplings $M_C$ between transmission line 720 and phase sampler 716. Central comparator bank 7CC has 64 comparators, as opposed to 16 for ADC 600. Dummy comparator banks 7DL and 7DR have 64 and 63 dummy comparators respectively, as opposed to 16 and 15 for ADC 600. ADC 700 has 64 comparator outputs Q, as opposed to 16 for ADC 600.

Further details of ADC 700 can be gleaned from FIGS. 3 and 4, which pertain to ADCs 600 and 700 just as they do for ADC 10. With the exception of the soliton curves, FIG. 2 also characterizes ADCs 600 and 700.

The soliton shape for ADC 700 is indicated by curve 708. Curve 708 has three peaks 741, 742 and 743. These peaks are actually sharper than illustrated. Even as illustrated, they are considerably sharper than the corresponding peaks for ADC 600, (which in turn are sharper than the peaks shown in FIG. 2 for ADC 10). This sharpness is obtained by appropriately adjusting $\beta$ for the links of transmission line 720.

The readout for curve 708 is shown at 710. This readout has three 1s and 61 0s. $I_{TH}$ is adjusted so that a readout with four 1s and 60 0s is equally likely. The steepness of peak 742 at $I_{TH}$ provides for reliable readings.

In terms of layout, ADC 700 simply requires more elements for each component. Dimensionally, ADC 700 is 4 times longer than ADC 600, but otherwise not wider or more complex. Thus, scaling to higher bit resolutions is straightforward. There are no additional hierarchical levels, as would be the case with the phase tree. There are no additional superconducting levels required, as there would be for the SQUID wheel.

Redundant sensor banks can be used to increase the confidence in the readout. For example, a five-section ADC can have three read sections. An average or modal value can be read out. The frequency and degree of reading discrepancies can be used to assign a confidence level to the readings. In such a case, "n" is the number of sensors per read section, rather than the total number of sensors. The use of extra read sections can also be used with the comparators for different phase positions distributed among sections to allow more room for comparator layout.

In ADC 10, the gradient currents are induced from a split current ladder. Alternatively, the source currents can be individually generated with the proper magnitudes and inductively coupled into the pump lines. Also, the "gradient current source" can generate constant currents that are variably coupled to pump lines to produced the desired flux gradient at the transmission line. For example, the current source can include a graduated series of inductors.

In the preferred linear (i.e., "straight") embodiments of the present invention, soliton displacements are translations. However, the present invention also can be implemented in nonlinear layouts, in which cases, the displacements can be nonlinear as well.

In the foregoing embodiments, the soliton was a spatially varying magnetic flux. However, the present invention provides for ADCs employing other types of solitons.

For example, a mode-locked laser can be coupled into a nonlinear optical fiber to generate optical solitons. The input can include a phase shifter inserted along the optical fiber (or between two optical fibers). The phase shifter can be responsive to an electrical or optical input. A linear array of evanescence detectors can be arranged downstream of the phase shifter. They can be phase locked to the laser so that they strobe the fiber at the pulse rate. As long as the phase shifter does not change, the light pattern detected by the detectors does not change. When the phase shifter changes, the light pattern shifts upstream or downstream accordingly. The detectors, which provide a digital readout of the light pattern phase, thus provide a digital representation of the input to the phase shifter. These and other modifications to and variations upon the preferred embodiments are provided for by the present invention, the scope of which is limited only by the following claims.

What is claimed is:

1. An analog-to-digital converter comprising:
    input means for receiving an input signal having a time-variable signal value;
    a phase sampler for digitally representing a phase of a periodic soliton by generating a series of sampling events, each sampling event providing a respective digital representation of said phase; and
    a soliton generator for generating said periodic soliton, said periodic soliton having a respective phase for each sampling event, said soliton means being coupled to said input means so that said phase varies as a function of said signal value, said soliton means being coupled to said sampling means to provide for sampling of said periodic soliton.

2. An analog-to-digital converter comprising:
    input means for receiving an input signal having a time-variable signal value;
    a phase sampler for digitally representing a phase of a periodic soliton by generating a series of sampling events, each sampling event providing a respective digital representation of said phase, said phase sampler including sensors at n different phase locations, each of said sensors indicating whether the respective local intensity of said soliton exceeds a predetermined threshold during each sampling event; and
    said soliton generator has respective local intensities at each of said phase locations, said soliton means shaping said soliton so that, for each sampling event,
    said soliton is above said threshold in at most $2 + \log_2(n)$ of said phase locations, and
    said soliton is below said threshold in at most $n - 2$ of said phase locations.

3. An analog-to-digital converter as recited in claim 2 wherein said soliton generator includes:
    a superconducting transmission line, said transmission line including a series of inductive links connected to ground via a corresponding series of Josephson junctions;
    pump means for injecting local pump currents into respective ones of said links, said local pump currents including signal components and gradient components, each of said pump currents including a respective one of said gradient components, said pump means being inductively coupled to said input means; and
    a gradient source for generating said gradient components so as to establish a flux gradient across said transmission line so that said soliton is a spatially-varying magnetic flux having a cycle length, said transmission line having a line length equal to an integer number r of cycle lengths.

4. An analog-to-digital converter as recited in claim 3 wherein said transmission line has a central section and two end sections, said central section including said phase locations, said central section having a central length equal to an integer number s of cycle lengths, where $s < r$, each of said Josephson junctions having a critical current, the critical currents of the Josephson junctions of each of said end sections decreasing with distance away from said central section.

5. An analog-to-digital converter as recited in claim 4 wherein each of the links of said central section has a respective $\beta < 1$.

6. An analog-to-digital converter as recited in claim 5 wherein said sensors are comparators inductively coupled to said links.

7. An analog-to-digital converter as recited in claim 3 wherein said soliton has at least three peaks at any given time;
    whereby a central peak of the three peaks is buffered from boundary conditions by the other two peaks.

8. A method for converting an analog signal into a digital representation, said method comprising the steps of:
    establishing a periodic soliton having a time-variable phase;
    receiving an input signal having a time-variable signal value;
    changing the phase of said periodic soliton as a function of said signal value so that said phase changes as a function of said signal value;
    detecting said phase; and
    digitally representing said phase.

9. A method for converting an analog signal into a digital representation, said method comprising the steps of:
    establishing a periodic soliton having a time-variable phase, said soliton being three cycles long;
    receiving an input signal having a time-variable signal value;

changing the phase of said periodic soliton as a function of said signal value so that said phase changes as a function of said signal value;

detecting said phase; and digitally representing said phase by detecting the position of a middle one of the three peaks.

10. A method for converting an analog signal into a digital representation, said method comprising the steps of:

establishing a periodic soliton having a time-variable phase;

receiving an input signal having a time-variable signal value;

changing the phase of said periodic soliton as a function of said signal value so that said phase changes as a function of said signal value;

detecting said phase; and digitally representing said phase using sensors at n different phase locations each determining whether the respective local intensity of said soliton exceeds a predetermined threshold; and in said establishing step, said soliton being shaped so that said soliton is above said threshold in at most $2 + \log_2(n)$ of said phase locations, and said soliton is below said threshold in at most $n-2$ of said phase locations.

* * * * *